(12) United States Patent
Chen et al.

(10) Patent No.: US 10,908,507 B2
(45) Date of Patent: *Feb. 2, 2021

(54) MICRO LED ARRAY ILLUMINATION SOURCE

(71) Applicant: Applied Materials, Inc., Santa Clara, CA (US)

(72) Inventors: Jang Fung Chen, Cupertino, CA (US); Christopher Dennis Bencher, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/910,775

(22) Filed: Mar. 2, 2018

(65) Prior Publication Data

US 2018/0188655 A1 Jul. 5, 2018

Related U.S. Application Data

(63) Continuation-in-part of application No. 15/649,341, filed on Jul. 13, 2017, now abandoned.

(Continued)

(51) Int. Cl.
*G03F 7/20* (2006.01)
*G02B 27/10* (2006.01)

(52) U.S. Cl.
CPC .......... *G03F 7/7015* (2013.01); *G02B 27/10* (2013.01); *G03F 7/70275* (2013.01);
(Continued)

(58) Field of Classification Search
CPC ............ G03F 7/70133; G03F 7/70191; G03F 7/70275; G03F 7/70383; G03F 7/70391; G03F 7/70591
(Continued)

(56) References Cited

U.S. PATENT DOCUMENTS

| 4,450,358 A | 5/1984 | Reynolds |
| 6,133,986 A | 10/2000 | Johnson |

(Continued)

FOREIGN PATENT DOCUMENTS

| JP | 2001085307 A | 3/2001 |
| JP | 2006295175 A | 10/2006 |

(Continued)

OTHER PUBLICATIONS

Hecht, Eugene. Optics: 4th Edition, pp. 218, 266 and 267. San Francisco: Addison-Wesley, 2002. Print. (Year: 2002).*

(Continued)

*Primary Examiner* — Colin W Kreutzer
(74) *Attorney, Agent, or Firm* — Patterson + Sheridan, LLC

(57) ABSTRACT

Embodiments of the present disclosure generally relate to apparatuses and systems for performing photolithography processes. More particularly, compact illumination tools for projecting an image onto a substrate are provided. In one embodiment, an illumination tool includes a microLED array including one or more microLEDs. Each microLED produces at least one light beam. The illumination tool also includes a beamsplitter adjacent the microLED array, a camera adjacent the beamsplitter, and a projection optics system adjacent the beamsplitter.

16 Claims, 6 Drawing Sheets

Related U.S. Application Data

(60) Provisional application No. 62/361,964, filed on Jul. 13, 2016.

(52) U.S. Cl.
CPC ...... *G03F 7/70391* (2013.01); *G03F 7/70641* (2013.01); *G02B 27/106* (2013.01)

(58) Field of Classification Search
USPC ...................................................... 355/52, 67
See application file for complete search history.

(56) References Cited

U.S. PATENT DOCUMENTS

| | | | |
|---|---|---|---|
| 9,494,800 B2 | 11/2016 | Border et al. | |
| 2006/0132734 A1* | 6/2006 | Luttikhuis | G03F 7/70616 355/53 |
| 2006/0227069 A1 | 10/2006 | Baselmans et al. | |
| 2008/0043345 A1* | 2/2008 | Dodoc | G02B 13/143 359/714 |
| 2009/0059197 A1 | 3/2009 | Nam et al. | |
| 2011/0013162 A1* | 1/2011 | Kiuchi | G03F 7/70716 355/53 |
| 2012/0026478 A1* | 2/2012 | Chen | G03F 7/70275 355/53 |
| 2016/0266498 A1* | 9/2016 | De Jager | G03F 7/70025 |
| 2018/0017876 A1* | 1/2018 | Chen | G03F 7/70391 |

FOREIGN PATENT DOCUMENTS

| | | |
|---|---|---|
| JP | 2007101592 A | 4/2007 |
| JP | 2008122963 A | 5/2008 |
| JP | 2010014796 A | 1/2010 |
| JP | 2010192905 A | 9/2010 |
| JP | 2013527593 A | 6/2013 |
| KR | 20120108048 A | 10/2012 |
| WO | 2015058978 A1 | 4/2015 |
| WO | 2015175274 A1 | 11/2015 |
| WO | 2017019482 A1 | 2/2017 |

OTHER PUBLICATIONS

Korean Office Action dated Mar. 16, 2020 for Application No. 10-2019-7001533.
D. Elfstrom et al.—"Mask-less ultraviolet photolithography based on CMOS-driven micro-pixel light emitting diodes," Optics Express, vol. 17, No. 26, pp. 23522-23529, 2009.
PCT International Search Report and Written Opinion dated Sep. 22, 2017, for International Application No. PCT/US2017/036989.
Japan Notice of Allowance dated Jan. 7, 2020 for Application No. 2019-501560.

* cited by examiner

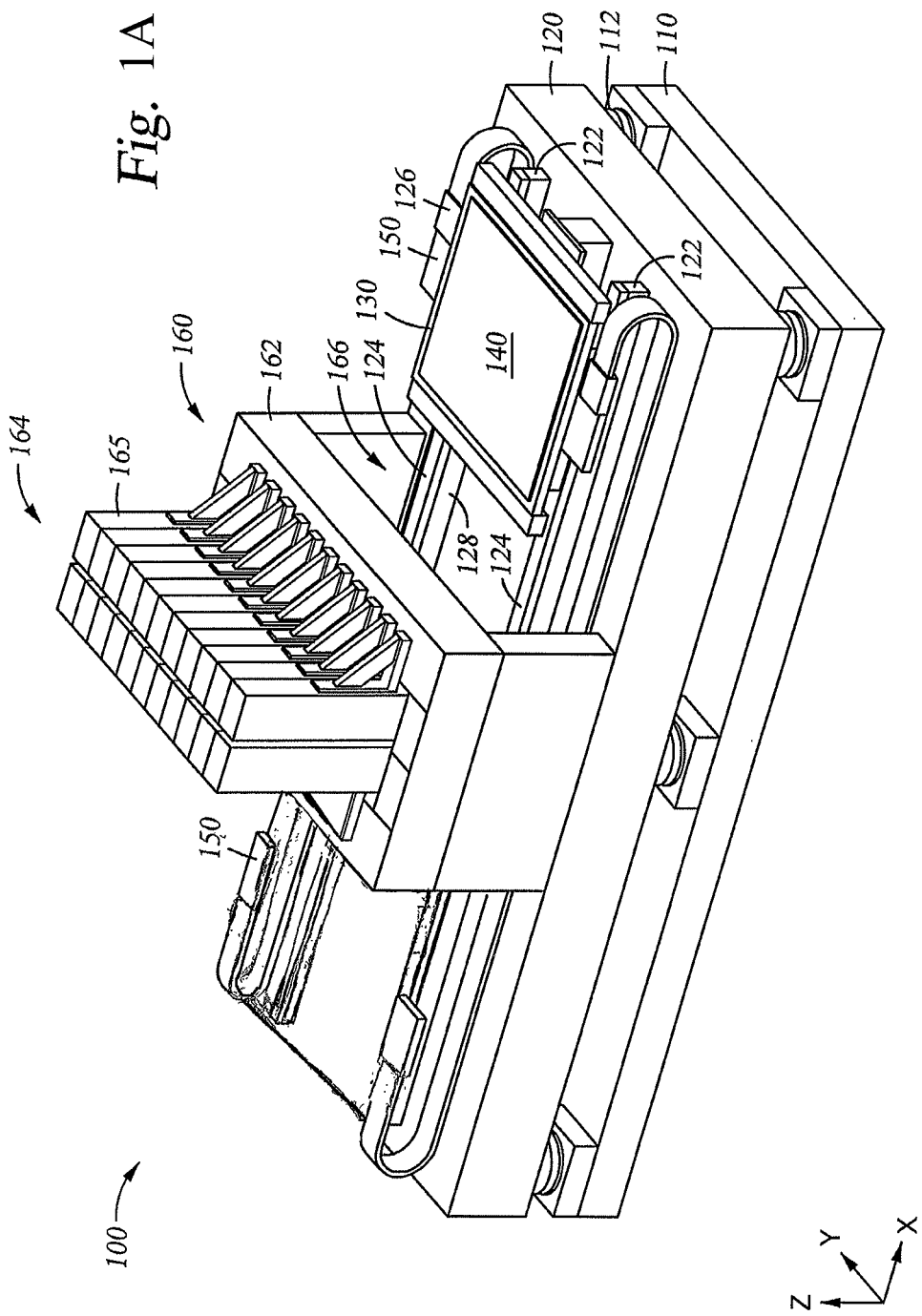

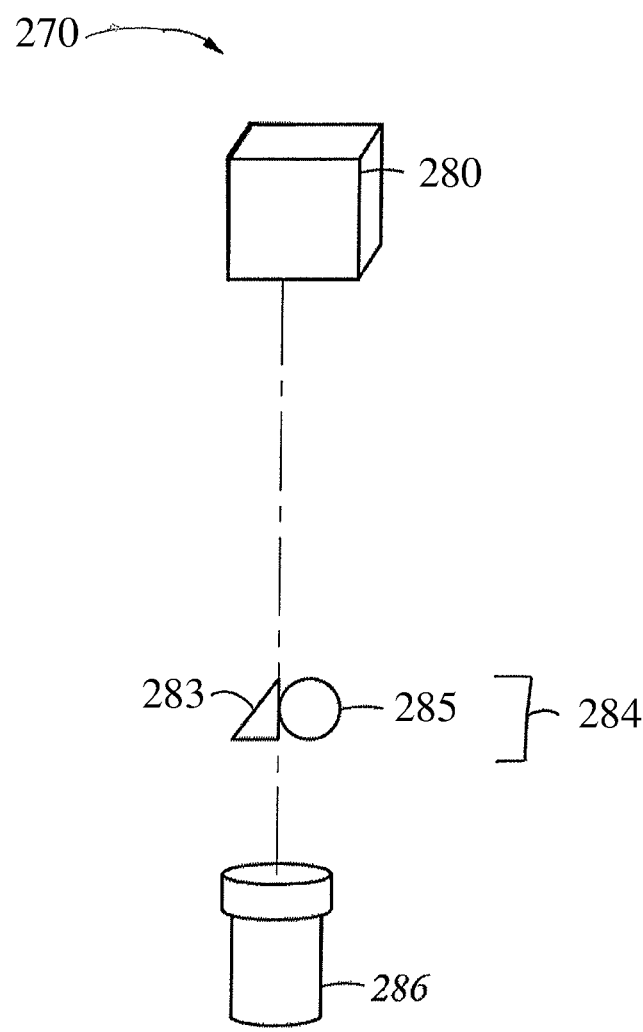

MICRO LED ARRAY ILLUMINATION SOURCE

CROSS-REFERENCE TO RELATED APPLICATIONS

This is a continuation-in-part application claiming benefit of U.S. non-provisional patent application Ser. No. 15/649,341, filed Jul. 13, 2017, which claims benefit of U.S. provisional patent application Ser. No. 62/361,964, filed Jul. 13, 2016, and which are herein incorporated by reference.

BACKGROUND

Field

Embodiments of the present disclosure generally relate to apparatuses and methods for processing one or more substrates, and more specifically to apparatuses and methods for performing photolithography.

Description of the Related Art

Photolithography is widely used in the manufacturing of semiconductor devices and display devices, such as liquid crystal displays (LCDs). Large area substrates are often utilized in the manufacture of LCDs. LCD based flat panel displays are commonly used for active matrix displays, such as computers, touch panel devices, personal digital assistants (PDAs), cell phones, television monitors, and the like. Generally, these flat panel displays include a layer of liquid crystal material forming individual pixels, which are sandwiched between two plates. When power from the power supply is applied across the liquid crystal material, the amount of light that can pass through the liquid crystal material is controllable at the pixel locations, enabling images to be generated on the display.

Microlithography techniques are generally employed to create features of film layers used to form electrodes and insulating materials used in flat panel displays. According to this technique, a light-sensitive photoresist is typically applied over a film layer on the substrate. Then, a pattern generator exposes selected areas of the light-sensitive photoresist with electromagnetic radiation (commonly referred to as light) in a preselected pattern to cause chemical changes to the photoresist in the selected exposure areas. The treated photoresist is then chemically treated, to remove either the exposed or unexposed portion thereof to form a mask having openings therethrough in a desired pattern for subsequent material removal and/or material addition processes using the openings in the mask.

In order to continue to provide display devices and other devices to consumers at the prices demanded by consumers, new apparatuses and methods are needed to precisely and cost-effectively create patterns on substrates, such as large area substrates used for flat panel displays.

SUMMARY

Embodiments of the present disclosure generally relate to apparatuses and systems for performing photolithography processes. More particularly, compact apparatuses for projecting an image onto a substrate are provided. In one embodiment, an illumination tool is disclosed. In one embodiment, an illumination tool includes a microLED array including one or more microLEDs. Each microLED produces at least one light beam. The illumination tool also includes a beamsplitter adjacent the microLED array, a camera adjacent the beamsplitter, and a projection optics system adjacent the beamsplitter.

In another embodiment, an illumination tool is disclosed. The illumination tool includes a microLED array. The microLED array includes one or more microLED with each microLED producing at least one light beam. The illumination tool also includes a beamsplitter adjacent the microLED array, a camera adjacent the beamsplitter, a projection optics system adjacent the beamsplitter, and a projection lens coupled to the projection optics system.

In another embodiment, an illumination tool system is disclosed. The illumination tool system includes two or more states configured to hold one or more substrates and a plurality of illumination tools for patterning the one or more substrates. Each illumination tool includes a microLED array including one or more microLEDs. Each microLED produces at least one light beam. The illumination tool also includes a beamsplitter adjacent the microLED array, a camera adjacent the beamsplitter, and a projection optics system adjacent the beamsplitter.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1A is a perspective view of a photolithography system according to embodiments disclosed herein.

FIG. 2A is a perspective schematic view of an image projection apparatus according to embodiments disclosed herein.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Figure 1B:
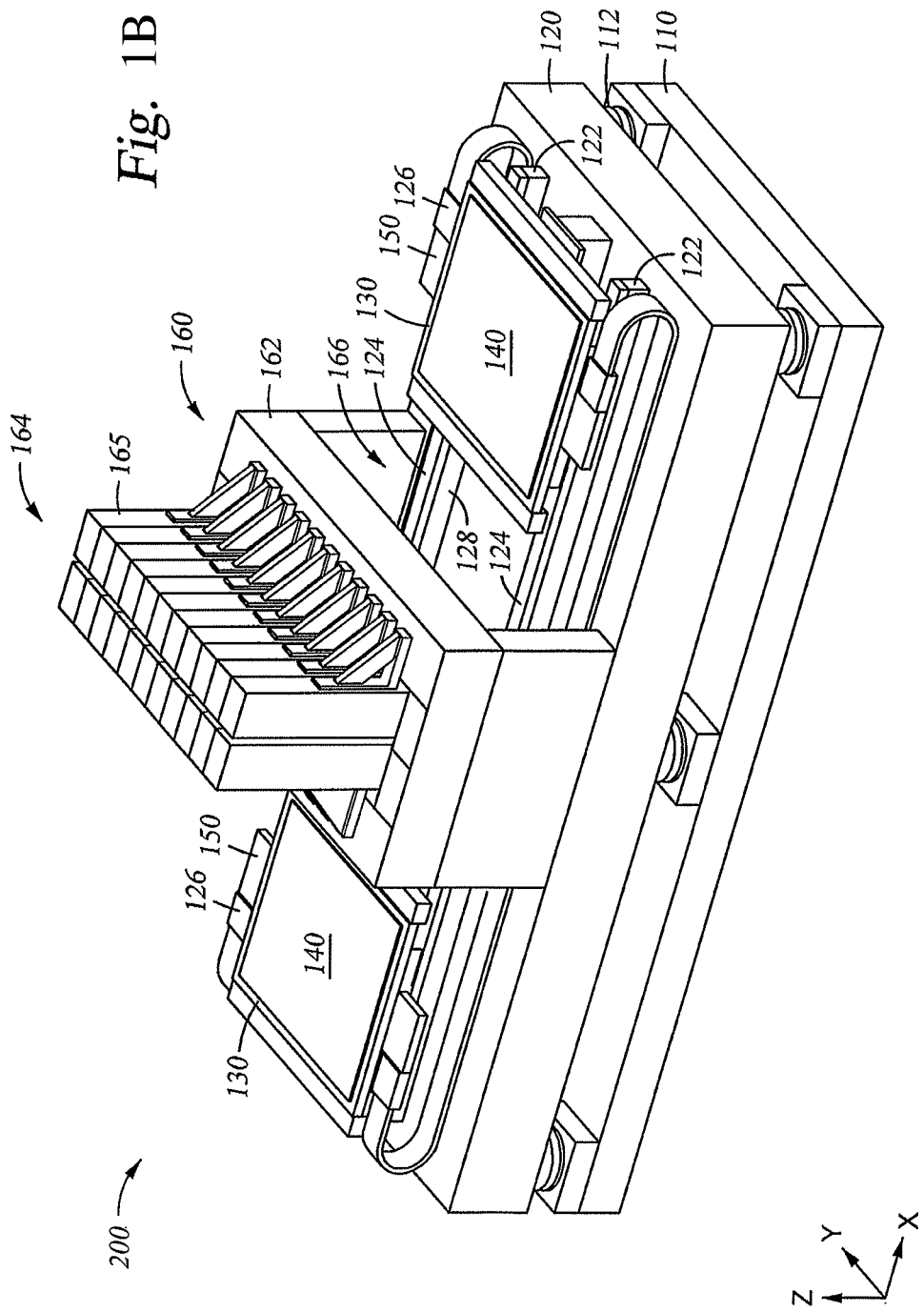
FIG. 1B is a perspective view of a photolithography system according to embodiments disclosed herein.

Embodiments of the present disclosure generally relate to apparatuses and systems for performing photolithography processes. More particularly, compact illumination tools for projecting an image onto a substrate are provided. In one embodiment, an illumination tool includes a microLED array including one or more microLEDs. Each microLED produces at least one light beam. The illumination tool also includes a beamsplitter adjacent the microLED array, a camera adjacent the beamsplitter, and a projection optics system adjacent the beamsplitter.

FIG. 1A is a perspective view of a photolithography system 100 according to embodiments disclosed herein. The system 100 includes a base frame 110, a slab 120, a stage 130, and a processing apparatus 160. The base frame 110 rests on the floor of a fabrication facility and supports the slab 120 above the floor. Passive air isolators 112 are positioned between the base frame 110 and the slab 120. In one embodiment, the slab 120 is a monolithic piece of granite, and the stage 130 is disposed on the slab 120. A substrate 140 is supported by the stage 130. A plurality of holes (not shown) are formed in the stage 130 for allowing a plurality of lift pins (not shown) to extend therethrough. In some embodiments, the lift pins rise to an extended position to receive the substrate 140, such as from one or more transfer robots (not shown). The one or more transfer robots are used to load and unload a substrate 140 from the stage 130.

The substrate 140 comprises any suitable material used as part of a flat panel display. In other embodiments, the substrate 140 is made of other materials. The substrate 140 has a photoresist layer formed thereon. The photoresist is sensitive to, and reacts when exposed to, at least certain wavelengths of electromagnetic radiation. A positive photoresist includes portions of the photoresist, which when exposed to electromagnetic radiation, will be respectively soluble to photoresist developer applied to the photoresist after a pattern is written into the photoresist using electromagnetic radiation. A negative photoresist includes portions of the photoresist, which when exposed to electromagnetic radiation, will be respectively insoluble to photoresist developer applied to the photoresist after the electromagnetic radiation pattern is written into the photoresist. The chemical composition of the photoresist determines whether the photoresist is a positive photoresist or negative photoresist. Examples of photoresists include, but are not limited to, at least one of diazonaphthoquinone, a phenol formaldehyde resin, poly(methyl methacrylate), poly(methyl glutarimide), and SU-8. In this manner, a pattern is created on a surface of a photoresist layer on the substrate 140 to form the electronic circuitry.

The system 100 includes a pair of supports 122 and a pair of tracks 124. The pair of supports 122 are disposed on the slab 120, and the slab 120 and the pair of supports 122 are a single piece of material. The pair of tracks 124 are supported by the pair of the supports 122, and the stage 130 moves along the tracks 124 in the X-direction. In one embodiment, the pair of tracks 124 is a pair of parallel magnetic channels. As shown, here each track 124 of the pair of tracks 124 extends in a straight line path. An encoder 126 is coupled to the stage 130 in order to provide information of the location of the stage 130 to a controller (not shown).

The processing apparatus 160 includes a support 162 and a processing unit 164. The support 162 is disposed on the slab 120 and includes an opening 166 therethrough for the stage 130 to pass under the processing unit 164. The processing unit 164 is supported over the slab 120 by the support 162. In one embodiment, the processing unit 164 is a pattern generator configured to expose photoresist in a photolithography process. In some embodiments, the pattern generator is configured to perform a maskless lithography process. The processing unit 164 includes a plurality of image projection apparatus (shown in FIGS. 2A and 2B). In one embodiment, the processing unit 164 contains as many as 84 image projection apparatuses. Each image projection apparatus is disposed in a case 165. The processing apparatus 160 is useful to perform maskless direct pattern writing to photoresist or other electromagnetic radiation sensitive material.

During operation, the stage 130 moves in the X-direction from a loading position, as shown in FIG. 1A, to a processing position. The processing position is one or more positions of the stage 130 as the stage 130 passes under the processing unit 164. During operation, the stage 130 is lifted from the tracks 124 by a plurality of air bearings (not shown) and while elevated from the tracks 124 moves along the pair of tracks 124 from the loading position to the processing position. A plurality of vertical guide air bearings (not shown) are coupled to the stage 130 and positioned adjacent an inner wall 128 of each support 122 in order to stabilize the movement of the stage 130. The stage 130 also moves in the Y-direction by moving along a track 150 for processing and/or indexing the substrate 140. The stage 130 is capable of independent operation and can scan a substrate 140 in one direction and step in the other direction.

A metrology system measures the X and Y lateral position coordinates of the stage 130, or as seen in FIG. 1B below, of each stage, in real time so that each of the plurality of image projection apparatus can accurately locate the patterns being written at the correct location on the photoresist covered substrate. The metrology system also provides a real-time measurement of the angular position of the stage 130 about the vertical or Z-axis. The angular position measurement can be used to hold the angular position of the stage 130 constant during scanning by means of a servo mechanism or it can be used to apply corrections to the positions of the patterns being written on the substrate 140 by the image projection apparatus 270, shown in FIGS. 2A-2B. These techniques may be used in combination.

FIG. 1B is a perspective view of a photolithography system 200 according to embodiments disclosed herein. The system 200 is similar to the system 100; however, the system 200 includes two stages 130. Each of the two stages 130 is capable of independent operation and can scan a substrate 140 in one direction and step in the other direction. Additionally, each stage 130 is capable of multiple passes under the processing unit 164, each pass being a scan in one direction and step in the other direction. In some embodiments, when one of the two stages 130 is scanning a substrate 140, another of the two stages 130 is unloading an exposed substrate and loading thereon a next substrate to be exposed.

While FIGS. 1A-1B depict two embodiments of a photolithography system, other systems and configurations are also contemplated herein. For example, photolithography systems including any suitable number of stages are also contemplated.

FIG. 2A is a perspective schematic view of an image projection apparatus 270 according to one embodiment, which is useful for a photolithography system, such as system 100 or system 200. The image projection apparatus 270 includes one or more spatial light modulators 280, an alignment and inspection system 284 including a focus sensor 283 and a camera 285, and projection optics 286. The components of image projection apparatus vary depending on the spatial light modulator being used. Spatial light modulators include, but are not limited to, microLEDs, digital micromirror devices (DMDs) and liquid crystal displays (LCDs).

In operation, the spatial light modulator 280 is used to modulate one or more properties of the electromagnetic radiation used to expose a pattern into the photoresist layer on a substrate, such as the amplitude, phase, or polarization thereof, which electromagnetic radiation is projected through the image projection apparatus 270 and to a substrate, such as the substrate 140. The alignment and inspection system 284 is used for alignment and inspection of the components of the image projection apparatus 270. In one embodiment, the focus sensor 283 includes a plurality of lasers which are directed through the lens of the camera 285 and then back through the lens of the camera 285 an imaged onto sensors to detect whether the beam spots projected from the lasers are in focus at the plane of the photoresist. The camera 285 is used to calibrate the pixel pitch or the distance from the center of one LED pixel or cluster to the center of the next LED pixel or cluster. As the pitch, or spacing, between the microLEDs changes sizes due to thermal expansion of the device components, the camera 285 is used to monitor and adjust for any change in the image projected on the substrate by calculating the change in distance from one pixel to the next. The camera 285 is used to image the substrate, such as substrate 140, to ensure the alignment of the image projection apparatus 270 and photolithography system 100 or 200 is correct or within an predetermined tolerance. The projection optics 286, such as one or more lenses, is used to project the electromagnetic radiation onto the substrate, such as the substrate 140.

Figure 2B:
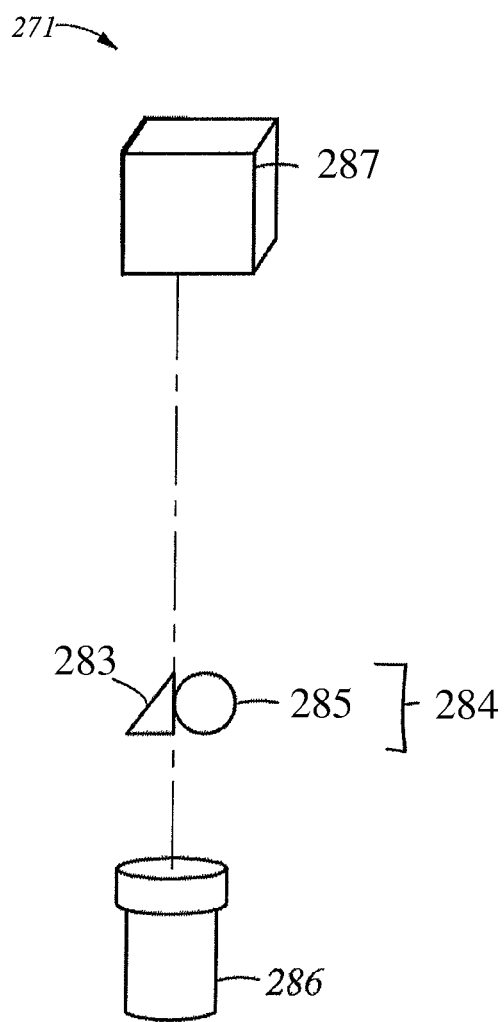
FIG. 2B is a perspective schematic view of an image projection apparatus according to embodiments disclosed herein.

FIG. 2B is an image project apparatus 271 according to embodiments described herein. In the embodiment shown in FIG. 2B, the image projection apparatus 271 includes one or more microLEDs 287 as the spatial light modulator(s), a focus sensor and camera system 284 and projection optics 286. In one embodiment, the image projection apparatus 271 further includes a beamsplitter (not shown). MicroLEDs are microscopic (for example, less than about 100 μm) light emitting devices, which may be arranged in an array and used to form the individual pixels of a panel. In one implementation, the light emitting devices may be diodes. In another implementation, the light emitting devices may be lasers, such as vertical-cavity surface-emitting laser (VCSEL) arrays. In one implementation, the VCSEL array is manufactured from a monolithic die with a plurality of lasers formed thereon. MicroLEDs include inorganic materials, such as an inorganic Gallium Nitride (GaN) material. Since microLEDs are self-emitting, an outside light source is not needed in the image projection apparatus 271. In one implementation, the microLED array is fabricated from a monolithic die with a plurality of light emitting devices formed thereon. In another implementation, the microLED array is fabricated by a pick and place method where previously assembled light emitting devices from various different panels are placed onto a single panel to create an array.

Figure 3:
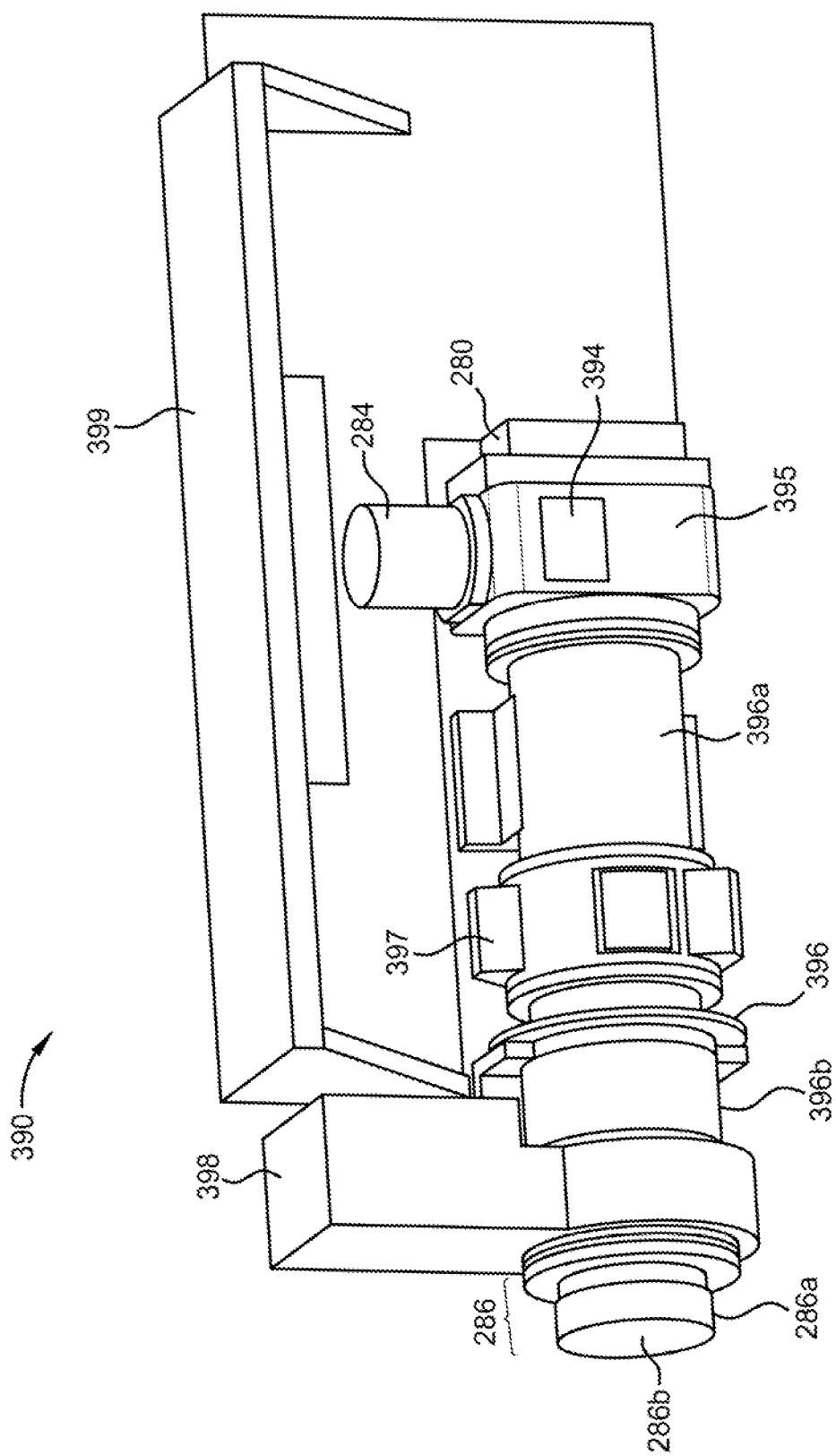
FIG. 3 is a perspective view of an illumination tool according to one embodiment.

FIG. 3 is a perspective view of an illumination tool 390 according to one embodiment. The illumination tool 390 is used to focus light to a certain spot on a plane of a substrate 140 and to ultimately project an image onto that substrate 140. Throughput is a very important parameter of any lithography system. To achieve a high throughput, each illumination tool 390 may be designed to be as narrow as possible in at least one direction so that many illumination tools 390 can be packed together in the width of a substrate 140. As such, the microLED array 280 provides for both a light source and independent control of an image being projected. The illumination tool includes the microLED array 280, a beamsplitter 395, one or more projection optics 396a, 396b, a distortion compensator 397, a focus motor 398, and a projection lens 286. The projection lens 286 includes a focus group 286a and a window 286b.

The electromagnetic energy produced from the MicroLED array 280 may cause thermal expansion of the display panel leading to image distortion, such that an image that was once within the field of view of the camera is now only partly visible. The distortion may be a pin-cushion distortion, a barrel distortion, or any other distortion. In one implementation, the distortion compensator 397 mechanically compensates for the distortion. For example, in one implementation, the distortion compensator 397 is a plurality of lenses used to correct for the distortion. The plurality of lenses may be concave, oblong, or convex lenses, that work together to correct the image by compensating and negating the distortion. In one embodiment, the light produced from the microLED array 280 is directed to an electromagnetic radiation sensor 394 so that the electromagnetic radiation intensity and wavelengths may be monitored. MicroLEDs produce various wavelengths of electromagnetic radiation ranging from actinic electromagnetic radiation at a wavelength of about 420-460 nm to broad-band electromagnetic radiation at a wavelength of 315-400 nm. The actinic, or visible electromagnetic radiation, and broadband, or ultraviolet electromagnetic radiation sources produced from the plurality of microLEDs in the microLED array 280 may be turned on and off independently of one another dependent upon the feedback from the electromagnetic radiation sensor 394. In one embodiment, the electromagnetic radiation sensor 394 is coupled to a beamsplitter 395. The beamsplitter 395 is used to split the electromagnetic radiation into two or more separate beams. The beamsplitter 395 is coupled to the one or more projection optics 396. Two projection optics 396a, 396b are shown in FIG. 3.

Together the projection optics 396, the distortion compensator 397, the focus motor 398, and the projection lens 286 project the image from the microLED array 280 onto the substrate 140. Projection optics 396a are coupled to the distortion compensator 397. The distortion compensator 397 is coupled to projection optics 396b, which is coupled to the focus motor 398. The focus motor 398 is coupled to the projection lens 286. The projection lens 286 includes a focus group 286a and a window 286b. The focus group 286a is coupled to the window 286b. The window 286b may be replaceable.

The microLED array 280, beamsplitter 395, one or more projection optics 396a, 396b and distortion compensator 397 are coupled to a mounting plate 399. The mounting plate 399 allows for precise alignment of each of the aforementioned components of the illumination tool 390 to one another. In other words, light travels through the illumination tool 390 along a single optical axis. This precise alignment along a single optical axis results in an apparatus that is compact. For example, the illumination tool 390 may have a thickness of between about 80 mm and about 100 mm. Accordingly, one benefit of the present disclosure is the ability to align multiple illumination tools to each other in a single tool. Furthermore, each of the image projection apparatuses is easily removable and replaceable, resulting in reduced down time for maintenance.

In one embodiment, a focus sensor 284 and camera 272 (Shown in FIG. 2) are attached to the beamsplitter 395. The focus sensor 284 and camera 272 may be configured to monitor various aspects of the imaging quality of the image projection apparatus 390, including, but not limited to, focus and alignment. In further embodiments, the focus sensor 284 and camera 272 may be used to capture images on the substrate 140 and make a comparison between those images. In other words, the focus sensor 284 and camera 272 may be used to perform inspection functions.

Figure 4:
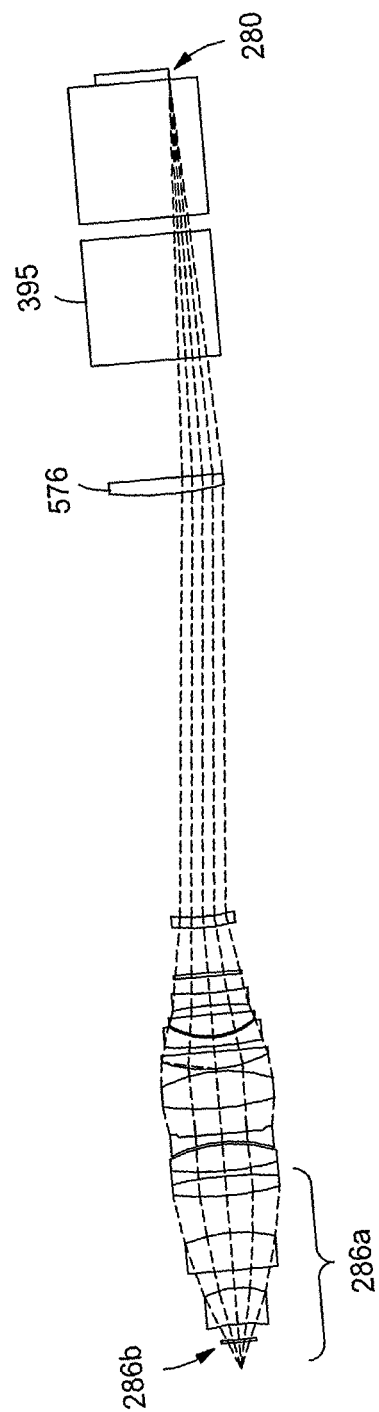
FIG. 4 is a cross-sectional view of a focus sensing mechanism according to one embodiment.

FIG. 4 is a cross-sectional view of the optical relays according to one embodiment. The optical relay may include a microLED array 280, a beamsplitter 395, a lens 576, and projection lens 286 which may include a focus group 286a and window 286b. The microLED array 280 is the imaging device of the illumination tool 390. The microLED array 280 includes a plurality of microLEDs arranged in an array. The edges of microLEDs are arranged in a straight line path, which may be the X axis and the Y axis. These axes are congruent with similar axis referenced to the substrate 140 or a stage coordinate system. Each individual microLEDs can be switched between on and off positions such that part of the array is on while another part of the array is off. The microLED array 280 is positioned such that the plane of surface of the microLED array 280 is parallel to the major surface of the substrate 140.

The incidence angle of the illumination beam from the microLEDs is adjusted and focused so the beam is aimed down the center of the illumination tool 390 and the image created in the illumination system is calibrated and in focus.

Use of the MicroLED array in the illumination tool helps to minimize the footprint of each illumination tool by eliminating the need for a an electromagnetic radiation source and a separate projection system to direct that radiation at the substrate. Instead, here the light generation and projection system is advantageously coupled into a single unit. The illumination tool utilizes the microLED array to perform calibrated and in focus photolithography.

While the foregoing is directed to embodiments of the present disclosure, other and further embodiments of the disclosure may be devised without departing from the basic scope thereof, and the scope thereof is determined by the claims that follow.

What is claimed is:

1. An illumination tool, comprising:
   a microLED array, wherein the microLED array comprises two or more microLEDs, wherein each microLED is a vertical cavity surface-emitting laser, has a size of less than 100 μm, and produces at least one light beam;
   a beamsplitter adjacent the microLED array, wherein the beamsplitter comprises an electromagnetic radiation sensor, and wherein each of the microLEDs is configured to be turned on and off independently of one another upon receiving feedback from the electromagnetic radiation sensor;
   a camera adjacent the beamsplitter;
   a projection optics system adjacent the beamsplitter;
   a projection lens adjacent the projection optics system;
   a focus sensor adjacent the camera; and
   a distortion compensator coupled to the projection optics system and disposed between the projection lens and the beamsplitter.

2. The illumination tool of claim 1, wherein the projection lens comprises a focus group.

3. The illumination tool of claim 2, wherein the projection lens further comprises a window coupled to the focus group.

4. The illumination tool of claim 3, further comprising a focus motor adjacent the focus group and the projection optics system.

5. An illumination tool, comprising:
   a microLED array, wherein the microLED array comprises two or more microLEDs, wherein each microLED is a vertical cavity surface-emitting laser, has a size of less than 100 μm, and produces at least one light beam;
   a beamsplitter adjacent the microLED array, wherein the beamsplitter comprises an electromagnetic radiation sensor, and wherein each of the microLEDs is configured to be turned on and off independently of one another upon receiving feedback from the electromagnetic radiation sensor;
   a camera adjacent the beamsplitter;
   a projection optics system adjacent the beamsplitter;
   a projection lens coupled to the projection optics system;
   a focus sensor adjacent the camera; and
   a distortion compensator coupled to the projection optics system.

6. The illumination tool of claim 5, wherein the projection lens further comprises a focus group.

7. The illumination tool of claim 6, wherein the projection lens further comprises a window coupled to the focus group.

8. The illumination tool of claim 7, wherein the focus sensor and camera are coupled orthogonally to the beamsplitter.

9. The illumination tool of claim 8, further comprising:
   a mounting plate, wherein the microLED array, the beamsplitter, and the projection optics system are coupled to the mounting plate.

10. An illumination tool system, comprising:
    two or more stages configured to hold one or more substrates; and
    one or more illumination tools for patterning the one or more substrates, wherein each illumination tool comprises:
    a microLED array, wherein the microLED array comprises two or more microLEDs, wherein each microLED is a vertical cavity surface-emitting laser, has a size of less than 100 μm, and produces at least one light beam;
    a beamsplitter adjacent the microLED array, wherein the beamsplitter comprises an electromagnetic radiation sensor, and wherein each of the microLEDs is configured to be turned on and off independently of one another upon receiving feedback from the electromagnetic radiation sensor;
    a camera adjacent the beamsplitter;
    a projection optics system adjacent the beamsplitter;
    a projection lens coupled to the projection optics system;
    a focus sensor adjacent the camera; and
    a distortion compensator coupled to the projection optics system and disposed between the projection lens and the beamsplitter.

11. The illumination tool system of claim 10, wherein the projection lens further comprises a focus group.

12. The illumination tool system of claim 11, wherein the projection lens further comprises a window coupled to the focus group.

13. The illumination tool system of claim 11, further comprising a mounting plate, wherein the microLED array, the beamsplitter, and the projection optics system are coupled to the mounting plate.

14. The illumination tool of claim 1, wherein the distortion compensator comprises a plurality of lens configured to correct an image by compensating and negating distortion.

15. The illumination tool of claim 5, wherein the distortion compensator comprises a plurality of lens configured to correct an image by compensating and negating distortion.

16. The illumination tool system of claim 10, wherein the distortion compensator comprises a plurality of lens configured to correct an image by compensating and negating distortion.

* * * * *